US008433547B2

(12) United States Patent
Dalgas et al.

(10) Patent No.: US 8,433,547 B2
(45) Date of Patent: Apr. 30, 2013

(54) SYSTEM AND METHOD FOR ANALYZING NONSTANDARD FACILITY OPERATIONS WITHIN A DATA CENTER

(75) Inventors: Mikkel Dalgas, Hejls (DK); Anders Thorbjoern Jensen, Jelling (DK)

(73) Assignee: Schneider Electric IT Corporation, West Kingston, RI (US)

( * ) Notice: Subject to any disclaimer, the term of this patent is extended or adjusted under 35 U.S.C. 154(b) by 735 days.

(21) Appl. No.: 12/630,035

(22) Filed: Dec. 3, 2009

(65) Prior Publication Data

US 2011/0137713 A1 Jun. 9, 2011

(51) Int. Cl.
G06G 7/56 (2006.01)
G06F 17/50 (2006.01)

(52) U.S. Cl.
USPC .............................................. 703/5

(58) Field of Classification Search ............. 703/5
See application file for complete search history.

(56) References Cited

U.S. PATENT DOCUMENTS

| | | | |
|---|---|---|---|
| 6,134,511 A | 10/2000 | Subbarao | |
| 6,889,908 B2 * | 5/2005 | Crippen et al. | 236/49.3 |
| 7,313,503 B2 | 12/2007 | Nakagawa et al. | |
| 7,596,476 B2 | 9/2009 | Rasmussen et al. | |
| 7,832,925 B2 * | 11/2010 | Archibald et al. | 374/29 |
| 2003/0084157 A1 * | 5/2003 | Graupner et al. | 709/226 |
| 2003/0115024 A1 | 6/2003 | Snevely | |
| 2003/0158718 A1 | 8/2003 | Nakagawa et al. | |
| 2005/0137824 A1 * | 6/2005 | Augustin et al. | 702/132 |
| 2006/0121421 A1 | 6/2006 | Spitaels et al. | |
| 2006/0161450 A1 * | 7/2006 | Carey et al. | 705/1 |
| 2006/0250970 A1 | 11/2006 | Gao et al. | |
| 2007/0294406 A1 | 12/2007 | Suer et al. | |
| 2009/0150129 A1 * | 6/2009 | Archibald et al. | 703/5 |
| 2010/0106464 A1 | 4/2010 | Hlasny et al. | |
| 2010/0292976 A1 * | 11/2010 | Newcombe et al. | 703/13 |

OTHER PUBLICATIONS

R.R. Schmidt, E.E. Cruz, M.K. Iyengar, "Challenges of data center thermal management" IBM J. Res. & Dev. vol. 49 No. 4/5 Jul./Sep. 2005, pp. 709-723.*
Tolia, N. et al., "Unified Thermal and Power Management in Server Enclosures", Proceedings of the ASME/Pacific Rim Technical Conference and Exhibition on Packaging and Integration of Electronics and Phontonic Systems, Interpack '09, vol. IPACK2009-89075, Jul. 19, 2009, pp. 1-10, XP002625027.
International Search Report and Written Opinion from corresponding PCT/US2010/058694 dated Mar. 9, 2011.

\* cited by examiner

Primary Examiner — Dwin M Craig
(74) Attorney, Agent, or Firm — Lando & Anastasi, LLP

(57) ABSTRACT

A computer implemented method and a data center management appliance for simulating nonstandard operation of an element of a data center is provided. The method includes acts of determining a one data center resource affected by a data center element, selecting a simulator from a plurality of simulators based on the data center resource and the data center element and generating a impact analysis of the nonstandard operation of the data center element using the simulator. The data center management appliance includes a network interface, a memory and a controller coupled to the network interface and the memory. The controller is configured to determine a data center resource affected by a data center element, select a simulator from a plurality of simulators based on the data center resource and the data center element and generate a impact analysis of nonstandard operation of the data center element using the first simulator.

20 Claims, 9 Drawing Sheets

SYSTEM AND METHOD FOR ANALYZING NONSTANDARD FACILITY OPERATIONS WITHIN A DATA CENTER

BACKGROUND

1. Field of the Invention

At least one aspect in accord with the present invention relates generally to apparatus and processes for modeling data centers, and more specifically, to apparatus and processes for analyzing the impact of nonstandard operation of one or more elements of a data center.

2. Discussion of Related Art

In response to the increasing demands of information-based economies, information technology networks continue to proliferate across the globe. One manifestation of this growth is the centralized network data center. A centralized network data center typically consists of various information technology equipment, collocated in a structure that provides network connectivity, electrical power and cooling capacity. Often the equipment is housed in specialized enclosures termed "racks" which integrate these communications, power and cooling elements. In some data center configurations, rows of racks are organized into hot and cold aisles to decrease the cost associated with cooling the information technology equipment. These characteristics make data centers a cost effective way to deliver the computing power required by many software applications.

Various processes and software applications have been developed to aid data center personnel in designing data centers. To enable the data center design process, some of these tools allow users to create logical models of data centers. These logical models allow users to plan, test and reconfigure a variety of data center layouts to determine which layouts can be expected to satisfy desired data center performance and cost characteristics.

SUMMARY OF THE INVENTION

Aspects in accord with the present invention manifest an appreciation that conventional data center management systems lack the ability to provide timely analysis of the overall impact to a data center of nonstandard operation of one or more elements included in a data center. These nonstandard operations may include any state of operation that is out of compliance with the expected operational performance of a data center element, such as sluggish operations, operations at decreased efficiency or capacity, and outright failure to operate. According to various examples, aspects provide for a prospective, multi-dimensional analysis of the effect of one or more data center element operating in a nonstandard fashion. In these examples, the analysis is conducted in response to a request from an external entity, such as a user or another system, and the results of the analysis are provided to the external entity. Thus examples can provide external entities with prospective, rather than retrospective, notifications detailing the potential impact of the nonstandard operation of one or more data center elements.

According to one example, a computer implemented method for simulating nonstandard operation of an element of a data center is provided. The method includes acts of determining at least first one data center resource affected by at least one first data center element, selecting at least one first simulator from a plurality of simulators based at least in part on the at least one first data center resource and the at least one first data center element and generating a first impact analysis of the nonstandard operation of the at least one first data center element using the at least one first simulator, wherein generating the analysis includes identifying at least one second data center element affected by the nonstandard operation of the at least one first data center element.

In the method, the act of determining the at least one first data center resource may include an act of receiving configuration management information from a database of benchmarks calculated at least in part on modeled information and at least in part on measurements taken during operation of the data center. In addition, the act of selecting the at least one first simulator may include an act of selecting at least two simulators and the act of generating the impact analysis may include an act of generating an impact analysis that spans at least two data center resources. Further, the act of selecting the at least one first simulator from the plurality of simulators may include an act of selecting the at least one first simulator from a plurality of simulators including at least one of a cooling simulator and a power simulator. Moreover, the act of generating the first impact analysis may include acts of generating a list of critically impacted data center elements and generating a list of data center elements with affected redundancy.

The method may further include acts of determining at least one second data center resource affected by at least one third data center element identified in the list of critically impacted data center elements, selecting at least one second simulator from the plurality of simulators based at least in part on the at least one second data center resource and the at least one third data center element and generating a second impact analysis of nonstandard operation of the at least one third data center element using the at least one second simulator. In addition, the method may further include an act of providing the impact analysis to an external entity. In the method, the act of providing the impact analysis to the external entity may include an act of providing the impact analysis to an external system via a system interface. In addition, the act of providing the impact analysis to the external entity may include an act of providing the impact analysis to a user via a user interface.

According to another example, a data center management appliance is provided. The data center management appliance includes a network interface, a memory and a controller coupled to the network interface and the memory. In this example, the controller is configured to determine at least one first data center resource affected by at least one first data center element, select at least one first simulator from a plurality of simulators based at least in part on the at least one first data center resource and the at least one first data center element and generate a first impact analysis of nonstandard operation of the at least one first data center element using the at least one first simulator, the first impact analysis identifying at least one second data center element affected by the nonstandard operation of the at least one first data center element.

In the data center management appliance, the controller configured to determine the at least one first data center resource may be further configured to receive configuration management information from a database of benchmarks calculated at least in part on modeled information and at least in part on measurements taken during operation of the data center. In addition, the controller configured to select the at least one first simulator and generate the impact analysis may be further configured to select at least two simulators and generate an impact analysis that spans at least two data center resources. Further, the controller configured to select the at least one first simulator from the plurality of simulators may be further configured to select the at least one first simulator from a plurality of simulators including at least one of a cooling simulator and a power simulator. Moreover, the controller configured to generate the first impact analysis may be further configured to generate a list of critically impacted data center elements and generate a list of data center elements with affected redundancy.

In the data center management appliance, the controller may be further configured to determine at least one second data center resource affected by at least one third data center element identified in the list of critically impacted data center elements, select at least one second simulator from the plurality of simulators based at least in part on the at least one second data center resource and the at least one third data center element and generate a second impact analysis using the at least one second simulator. In addition, the controller may be further configured to provide the impact analysis to an external entity. Further, the controller configured to provide the impact analysis to the external entity may be further configured to provide the impact analysis to an external system via a system interface. Moreover, the controller configured to provide the impact analysis to the external entity may be further configured to provide the impact analysis to a user via a user interface.

According to another example, a data center management appliance is provided. The data center management appliance includes a network interface, a memory and mechanism for analyzing, for a plurality of data center resources, an impact of nonstandard operation of at least one first data center element, the mechanism for analyzing including a mechanism for identifying at least one second data center element affected by the nonstandard operation of the at least one first data center element. In this example, the mechanism for analyzing may include a mechanism for analyzing at least one of cooling and power.

Still other aspects, examples, and advantages of these exemplary aspects and examples, are discussed in detail below. Any example disclosed herein may be combined with any other example in any manner consistent with at least one of the objects, aims, and needs disclosed herein, and references to "an example," "some examples," "an alternate example," "various examples," "one example," "at least one example," "this and other examples" or the like are not necessarily mutually exclusive and are intended to indicate that a particular feature, structure, or characteristic described in connection with the example may be included in at least one example. The appearances of such terms herein are not necessarily all referring to the same example. The accompanying drawings are included to provide illustration and a further understanding of the various aspects and examples, and are incorporated in and constitute a part of this specification. The drawings, together with the remainder of the specification, serve to explain principles and operations of the described and claimed aspects and examples.

BRIEF DESCRIPTION OF DRAWINGS

Various aspects of at least one example are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

Figure 1:
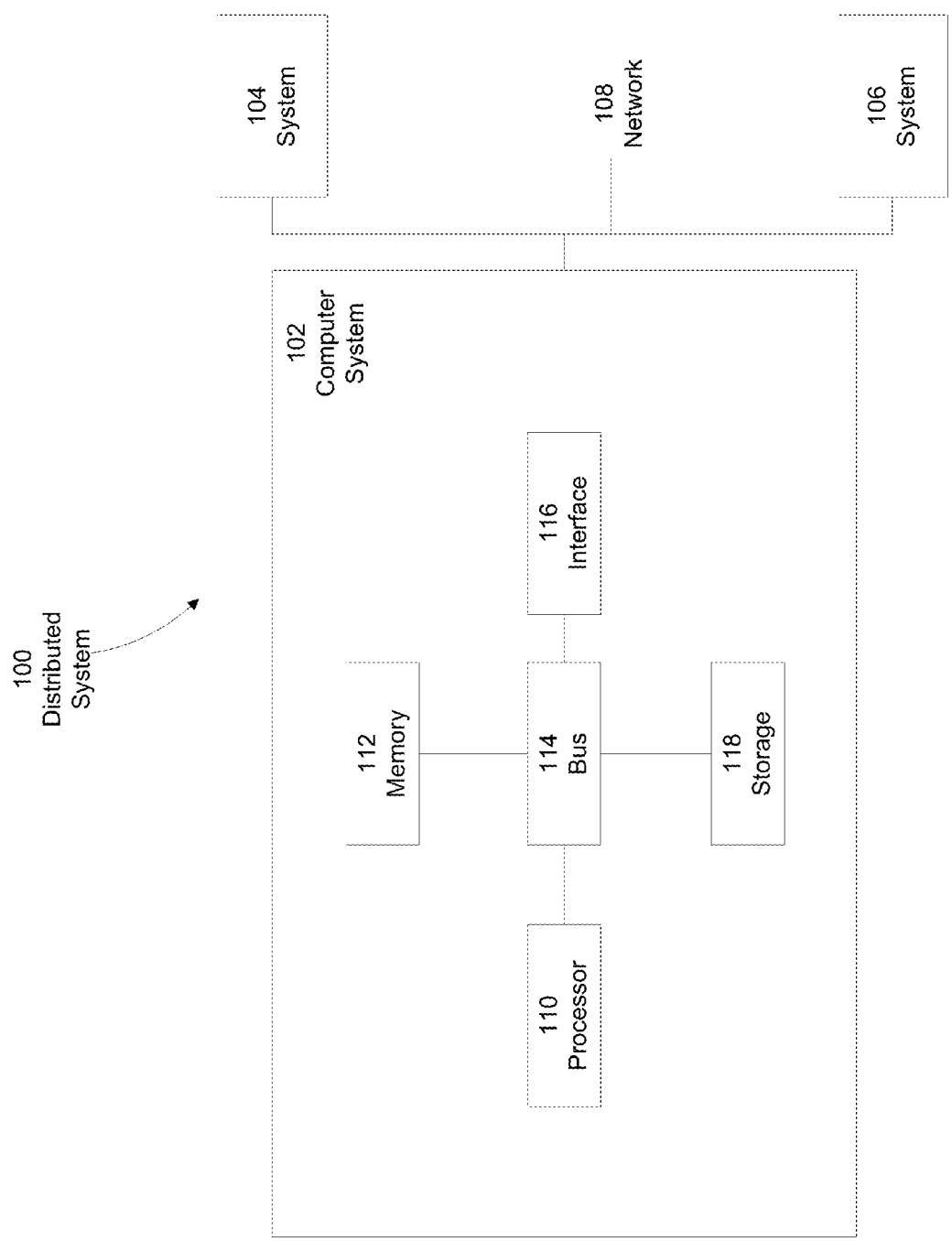
FIG. 1 is a block diagram of an example computer system in which various aspects in accord with the present invention may be implemented.

Aspects and examples relate to apparatus and processes that assess the impact of nonstandard operations of one or more elements within a data center. These elements may provide or consume one or more data center resources. A data center resource may include, for example, any characteristic of a data center that enables data center equipment functionality. Examples of data center resources include power, cooling, physical space (such as physical floor space and rack U space), remote equipment control capability, virtualized resources, distributed computing resources, shared data storage, software provisioning, network time synchronization, physical and logical security and physical and logical network connectivity and data transmission. According to one example, a computer system is specially configured to conduct a multi-dimensional analysis which calculates the effect of a data center element operating in a nonstandard way on the provision and consumption of one or more data center resources. In some examples, the specially configured computer system is a data center management appliance, as discussed further below. In these examples, the calculated effect on data center resource availability is ultimately translated into an overall impact assessment potentially involving all of the elements of the data center.

Examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. In particular, acts, elements and features discussed in connection with any one or more examples are not intended to be excluded from a similar role in any other examples.

Also, the phraseology and terminology used herein is for the purpose of description and should not be regarded as limiting. Any references to examples or elements or acts of the apparatus and methods herein referred to in the singular may also embrace examples including a plurality of these elements, and any references in plural to any example or element or act herein may also embrace examples including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present apparatus and methods or their components to any one positional or spatial orientation.

Computer System

Various aspects and functions described herein may be implemented as hardware or software on one or more computer systems. There are many examples of computer systems currently in use. These examples include, among others, network appliances, personal computers, workstations, mainframes, networked clients, servers, media servers, application servers, database servers and web servers. Other examples of computer systems may include mobile computing devices, such as cellular phones and personal digital assistants, and network equipment, such as load balancers, routers and switches. Further, aspects may be located on a single computer system or may be distributed among a plurality of computer systems connected to one or more communications networks.

For example, various aspects and functions may be distributed among one or more computer systems configured to provide a service to one or more client computers, or to perform an overall task as part of a distributed system. Additionally, aspects may be performed on a client-server or multi-tier system that includes components distributed among one or more server systems that perform various functions. Consequently, examples are not limited to executing on any particular system or group of systems. Further, aspects may be implemented in software, hardware or firmware, or any combination thereof. Thus, aspects may be implemented within methods, acts, systems, system elements and components using a variety of hardware and software configurations, and examples are not limited to any particular distributed architecture, network, or communication protocol.

Referring to FIG. 1, there is illustrated a block diagram of a distributed computer system 100, in which various aspects and functions may be practiced. The distributed computer system 100 may include one more computer systems that exchange, i.e. send or receive, information. For example, as illustrated, the distributed computer system 100 includes computer systems 102, 104 and 106. As shown, the computer systems 102, 104 and 106 are interconnected by, and may exchange data through, communication a network 108. The network 108 may include any communication network through which computer systems may exchange data. To exchange data using the network 108, the computer systems 102, 104 and 106 and the network 108 may use various methods, protocols and standards, including, among others, Token Ring, Ethernet, Wireless Ethernet, Bluetooth, TCP/IP, UDP, DTN, HTTP, FTP, SNMP, SMS, MMS, SS7, JSON, SOAP, CORBA, REST and Web Services. To ensure data transfer is secure, the computer systems 102, 104 and 106 may transmit data via the network 108 using a variety of security measures including, for example, TSL, SSL or VPN. While the distributed computer system 100 illustrates three networked computer systems, the distributed computer system 100 is not so limited and may include any number of computer systems and computing devices, networked using any medium and communication protocol.

Various aspects and functions may be implemented as specialized hardware or software executing in one or more computer systems including the computer system 102 shown in FIG. 1. As depicted, the computer system 102 includes a processor 110, a memory 112, a bus 114, an interface 116 and a storage 118. The processor 110 may perform a series of instructions that result in manipulated data. The processor 110 may be a commercially available processor such as an Intel Xeon, Itanium, Core, Celeron, Pentium, AMD Opteron, Sun U1traSPARC, IBM Power5+, or IBM mainframe chip, but may be any type of processor, multiprocessor or controller. The processor 110 is connected to other system elements, including one or more memory devices 112, by the bus 114.

The memory 112 may be used for storing programs and data during operation of the computer system 102. Thus, the memory 112 may be a relatively high performance, volatile, random access memory such as a dynamic random access memory (DRAM) or static memory (SRAM). However, the memory 112 may include any device for storing data, such as a disk drive or other non-volatile storage device. Various examples may organize the memory 112 into particularized and, in some cases, unique structures to perform the functions disclosed herein.

Components of the computer system 102 may be coupled by an interconnection element such as the bus 114. The bus 114 may include one or more physical busses, for example, busses between components that are integrated within a same machine, but may include any communication coupling between system elements including specialized or standard computing bus technologies such as IDE, SCSI, PCI and InfiniBand. Thus, the bus 114 enables communications, for example, data and instructions, to be exchanged between system components of the computer system 102.

The computer system 102 also includes one or more interface devices 116 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the computer system 102 to exchange information and communicate with external entities, such as users and other systems.

The storage system 118 may include a computer readable and writeable nonvolatile data storage medium in which instructions are stored that define a program that may be executed by the processor 110. The storage system 118 also may include information that is recorded, on or in, the medium, and this information may be processed by the processor 110 during execution of the program. More specifically, the information may be stored in one or more data structures specifically configured to conserve storage space or increase data exchange performance. The instructions may be persistently stored as encoded signals, and the instructions may cause the processor 110 to perform any of the functions described herein. The medium may, for example, be optical disk, magnetic disk or flash memory, among others. In operation, the processor 110 or some other controller may cause data to be read from the nonvolatile recording medium into another memory, such as the memory 112, that allows for faster access to the information by the processor 110 than does the storage medium included in the storage system 118. The memory may be located in the storage system 118 or in the memory 112, however, the processor 110 may manipulate the data within the memory 112, and then copy the data to the medium associated with the storage system 118 after processing is completed. A variety of components may manage data movement between the medium and integrated circuit memory element and examples is not limited thereto. Further, examples are not limited to a particular memory system or storage system.

Although the computer system 102 is shown by way of example as one type of computer system upon which various aspects and functions may be practiced, aspects are not limited to being implemented on the computer system 102 as shown in FIG. 1. Various aspects and functions may be practiced on one or more computers having a different architectures or components than that shown in FIG. 1. For instance, the computer system 102 may include specially programmed, special-purpose hardware, such as for example, an application-specific integrated circuit (ASIC) tailored to perform a particular operation disclosed herein. While another example may perform the same function using a grid of several general-purpose computing devices running MAC OS System X with Motorola PowerPC processors and several specialized computing devices running proprietary hardware and operating systems.

The computer system 102 may be a computer system including an operating system that manages at least a portion of the hardware elements included in the computer system 102. Usually, a processor or controller, such as the processor 110, executes an operating system which may be, for example, a Windows-based operating system, such as, Windows NT, Windows 2000 (Windows ME), Windows XP or Windows Vista operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems, or a UNIX operating systems available from various sources. Many other operating systems may be used, and examples are not limited to any particular implementation.

The processor 110 and operating system together define a computer platform for which application programs in high-level programming languages may be written. These component applications may be executable, intermediate, bytecode or interpreted code which communicates over a communication network, for example, the Internet, using a communication protocol, for example, TCP/IP. Similarly, aspects may be implemented using an object-oriented programming language, such as .Net, SmallTalk, Java, C++, Ada, or C# (C-Sharp). Other object-oriented programming languages may also be used. Alternatively, functional, scripting, or logical programming languages may be used.

Additionally, various aspects and functions may be implemented in a non-programmed environment, for example, documents created in HTML, XML or other format that, when viewed in a window of a browser program, render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used.

The examples disclosed herein may perform a wide variety of functions and may be implemented using various tools. For instance, aspects of an exemplary system may be implemented using an existing commercial product, such as, for example, Database Management Systems such as SQL Server available from Microsoft of Seattle, Wash., Oracle Database from Oracle of Redwood Shores, Calif., and MySQL from Sun Microsystems of Santa Clara, Calif. or integration software such as Web Sphere middleware from IBM of Armonk, N.Y. A computer system running, for example, SQL Server may be able to support both aspects in accord with specific examples disclosed herein and databases for sundry other applications not discussed in the present disclosure. Thus, functional components disclosed herein may include a wide variety of elements, such as executable code, data structures or objects, configured to perform their described functions.

System Context Diagram

Figure 2:
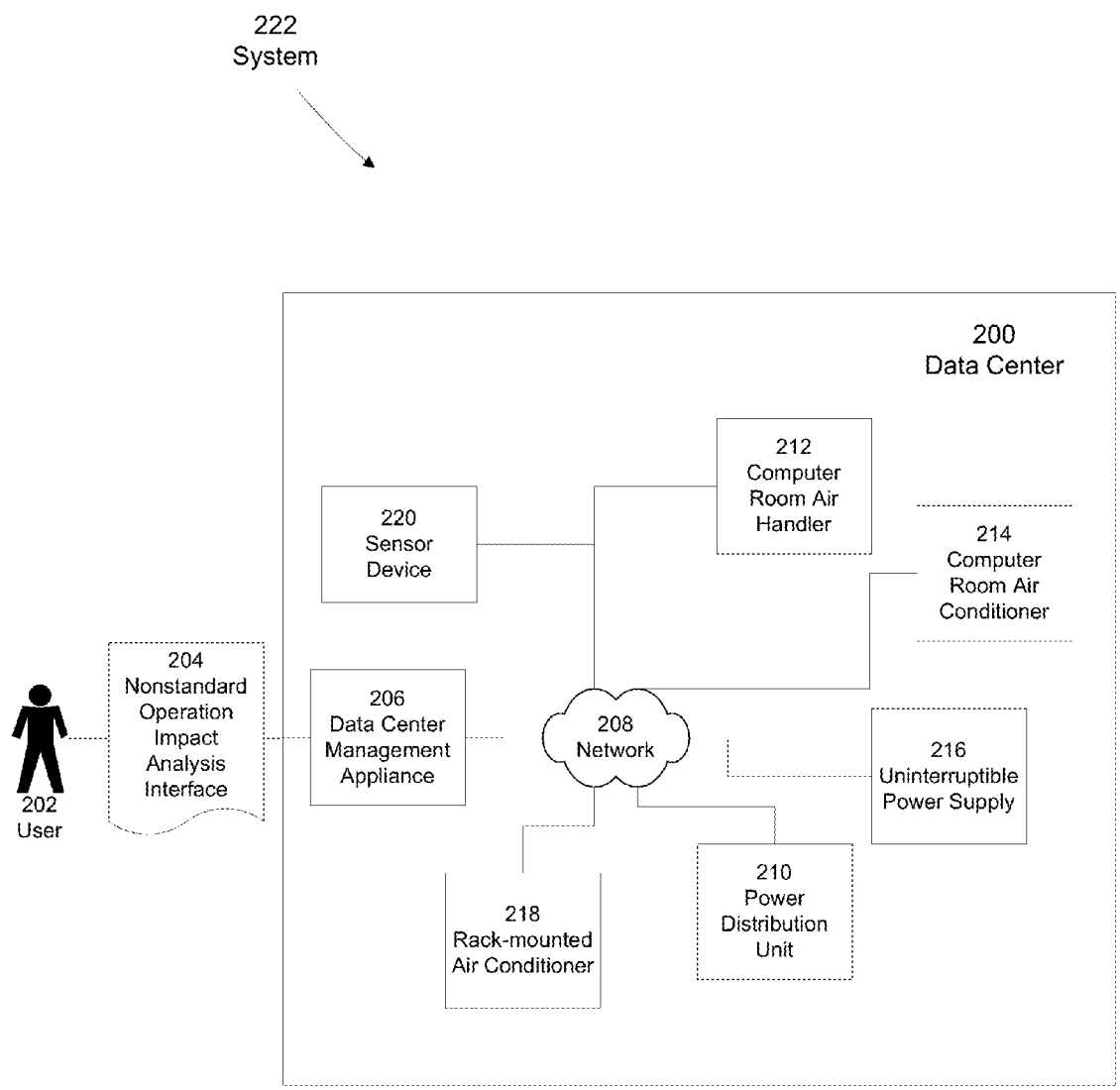
FIG. 2 is a block diagram of a data center including a data center management appliance in accord with aspects of the present invention.

FIG. 2 presents a context diagram including physical and logical elements of distributed system 222. As shown, distributed system 222 is specially configured to perform the various functions disclosed herein. The system structure and content disclosed with regard to FIG. 2 is for exemplary purposes only and is not intended to limit examples to the specific structure shown in FIG. 2. As will be apparent to one of ordinary skill in the art, many variant exemplary system structures can be architected. The particular arrangement presented in FIG. 2 was chosen to promote clarity.

Information may flow between the elements, components and subsystems described herein using any technique. Such techniques include, for example, passing the information over the network via TCP/IP, passing the information between modules in memory and passing the information by writing to a file, database, or some other non-volatile storage device. In addition, pointers or other references to information may be transmitted and received in place of, or in addition to, copies of the information. Conversely, the information may be exchanged in place of, or in addition to, pointers or other references to the information. Other techniques and protocols for communicating information may be used without departing from the scope of the examples discussed herein.

Referring to FIG. 2, a system 222 includes a user 202, a nonstandard operation impact analysis interface 204 and a data center 200. The elements of the data center 200 include a set of data center resource providers and consumers. Examples of data center resource providers may include power generation and distribution equipment, cooling generation and distribution equipment, floor space, racks, logical network connectivity software, sensor equipment and data transmission equipment, physical network connectivity equipment, physical access control equipment, data storage equipment, distributed application services equipment, network time synchronization equipment and remote device control equipment.

A non-limiting list of various exemplary data center resource providers follows. Other examples may employ other data center resource providers. Exemplary power generation and distribution equipment may include transformers, automatic transfer switches (ATSs), uninterruptible power supplies (UPSs), generators, single-phase and three-phase power distribution units (PDUs), rack mounted PDUs and individual outlets in PDUs. Examples of coolant generation and distribution providers may include computer room air handlers (CRAHs), computer room air conditioners (CRACs), fluid distribution systems, refrigerant distribution systems, rack-mounted air conditioners (RMACs), rack fans, raised floors, dropped ceilings, plenum, perforated tiles and non-perforated tiles. Exemplary logical network connectivity software and data transmission equipment may include Domain Name System servers, Microsoft Active Directory servers, Virtual Local Area Networks, Remote Authentication Dial In User Service servers, Terminal Access Controller Access-Control System Plus servers, Lightweight Directory Access Protocol directories, Remote Authentication Dial In User Service servers, network access control systems, firewalls, Ethernet switches Dynamic Host Configuration Protocol Services servers, File Transfer Protocol servers, Remote Direct Memory Access over Internet Protocol connections, load balancers and InfiniBand switches. Examples of physical network connectivity equipment may include network cabling, patch panels, and physical matrix switches. Exemplary physical space access control equipment may include security cameras, room door locks, rack door locks, door contact sensors, card readers and radio frequency identification readers. Examples of shared data storage equipment include Network File System servers, Network Attached Storage servers and storage area network servers. Exemplary distributed application services include Web Services servers. Exemplary network time synchronization equipment may include Network Time Protocol servers. Examples of remote equipment control equipment may include console port servers and Keyboard Video Mouse (KVM) switches. Examples of sensor equipment may include environmental sensors, such as temperature, humidity and airflow sensors.

While many of these data center resource providers primarily provide a singular type of data center resource (for example, PDUs primarily provide power), any given data center resource provider is not limited to providing a single type of data center resource. For example, as discussed above, racks may provide several types of data center resources to data center equipment. More specifically, in many examples, racks provide cooling, power, physical space and weight support resources to data center equipment housed within the racks. In addition, data center resource providers may also be data center resource consumers. For example, PDUs provide power but consume floor space.

Some data center elements may include enough computing resources to control the operation of the data center resource element. These computing resources are typically limited and tailored to support the operation of the data center resource element. In at least one example, these limited computer resources may be disposed upon a Network Management Card (NMC) such as a UPS NMC available from APC by Schneider Electric.

The particular data center elements shown in FIG. 2 include a data center management appliance 206, a communications network 208, a PDU 210, a CRAH 212, a CRAC 214, a UPS 216 and a RMAC 218, and a sensor device 220. The network 208 may be, among other types of networks, a private network (such as a LAN, WAN, extranet or intranet) or may be a public network (such as the internet). In the example shown, the network 208 is a LAN. Each of the data center elements shown in FIG. 2 may transmit information via the network 208 to the data center management appliance 206. This information may include both direct and circumstantial evidence indicating an existing or imminent nonstandard operational state for a data center element, such as sluggish or inoperative data center resource provider behavior, nonstandard environmental conditions or other information showing the lack of normal provision or consumption of data center resources.

As shown in FIG. 2, the data center management appliance 206 is configured to provide the nonstandard operation impact analysis interface 204 to an external entity, such as the user 202. A data center management appliance is an industrial computer system designed to be installed in, and to accommodate the rigors of, the data center environment. Data center management appliances are manufactured to perform a well-defined set of functions directed toward data center modeling, monitoring and control.

In another example, the nonstandard operation impact analysis interface 204 is configured to accept an indication of one or more data center elements for nonstandard operation analysis and to present the results of the nonstandard operation analysis to the user 202. In at least one example, the nonstandard operation impact analysis interface 204 is a browser-based user interface served and rendered by the data center management appliance 206. In another example, the nonstandard operation impact analysis interface is a system interface that receives and responds to calls made according to a predetermined interface protocol. In other examples, other suitable user and system interfacing technologies may be used. Thus, according to a variety of examples, the nonstandard operation impact analysis 204 may include a plurality of individual interfaces that provide for initiation of a nonstandard operation analysis and review of the results.

According to various examples, the data center management appliance 206 is configured to conduct an analysis of the nonstandard operation of one or more data center elements. In some examples, the analysis includes calculations that determine the impact of the nonstandard operation across multiple types of data center resources. In these examples, the analysis also considers both whether the data center element is a data center resource provider, consumer or both.

For instance, a user may wish to determine the affect of a CRAC operating in a nonstandard fashion under a particular data center configuration. Given this goal, the user can select the CRAC for analysis. When conducting the analysis, a data center management appliance may calculate the impact of the nonstandard operation of the CRAC on two types of data center resources, namely power and cooling. More specifically, these calculations may reflect the fact that the CRAC provides cooling and also consumes power. Thus examples provide for a rigorous, multidimensional analysis of the impact of data center element nonstandard operations.

Example System Architecture

Figure 3:
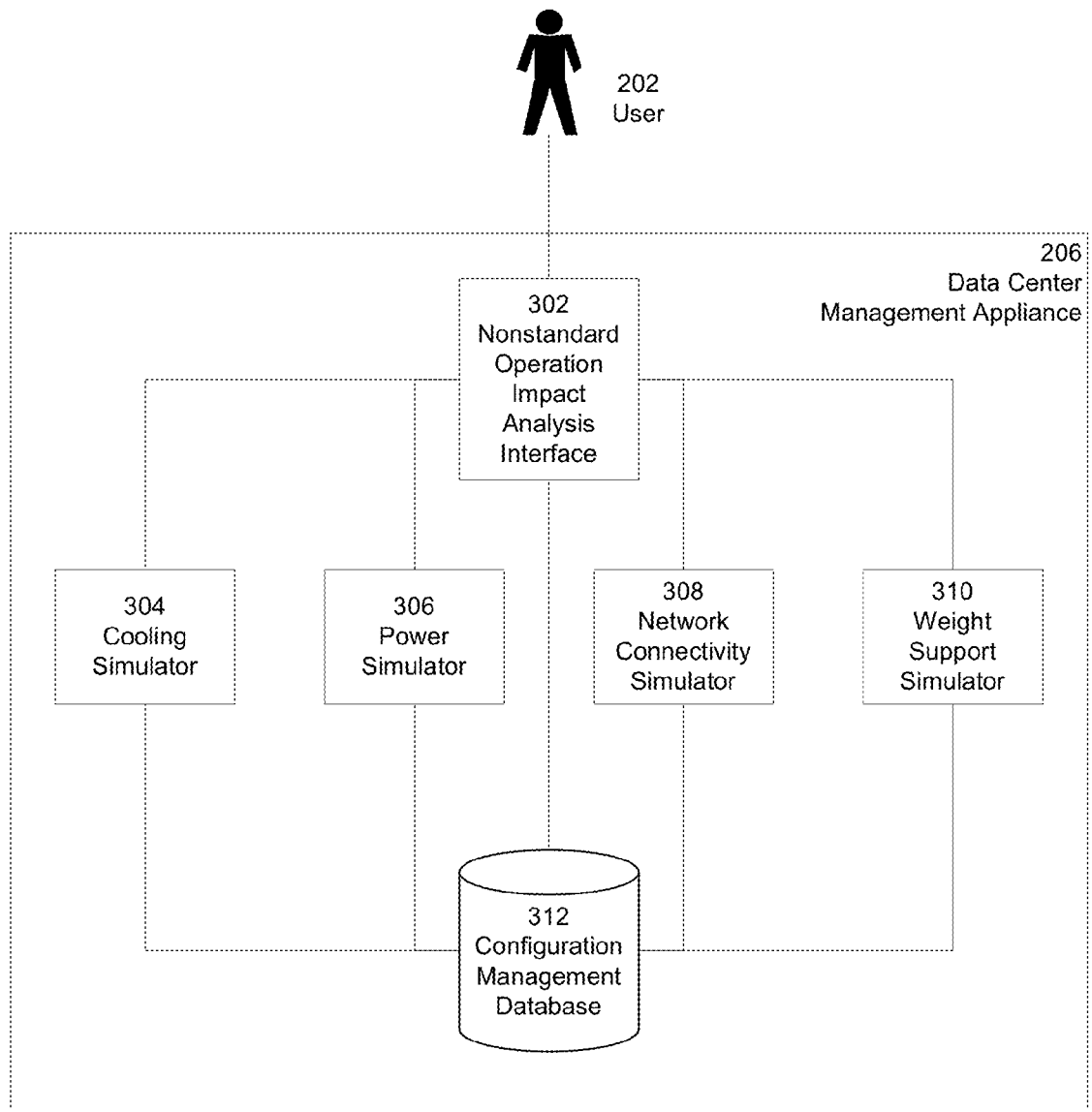
FIG. 3 is a block diagram of a data center management appliance in accord with the present invention.

FIG. 3 provides a more detailed illustration of a particular physical and logical configuration of the data center management appliance 206. The system structure and content discussed below are for exemplary purposes only and are not intended to limit examples to the specific structure shown in FIG. 3. As will be apparent to one of ordinary skill in the art, many variant exemplary system structures can be architected. The particular arrangement presented in FIG. 3 was chosen to promote clarity.

In the example shown in FIG. 3, the data center management appliance 206 includes a nonstandard operation impact analysis interface 302, a cooling simulator 304, a power simulator 306, a network connectivity simulator 308, weight support simulator 310 and a configuration management database 312. As shown, the nonstandard operation impact analysis interface 302 exchanges analysis information with external entities, such as the user 202, and the cooling simulator 304, the power simulator 306, the network connectivity simulator 308, the weight support simulator 310 and the configuration management database 312. This analysis information may include information related to analyzing the impact of nonstandard operations of one or more data center elements.

Examples of analysis information include information indicating data center elements targeted for nonstandard operation impact analysis, qualitative and quantitative information describing the nonstandard operation, data center resources affected by the nonstandard operation and the like. Each of the simulators 304, 306, 308 and 310 exchange analysis information with the nonstandard operation impact analysis 302 and data center configuration information with the configuration management database 312.

In the example depicted in FIG. 3, the configuration management database 312 includes elements configured to store and retrieve configuration management information. In general, this configuration management information may include any information that describes characteristics or elements of a data center. Thus, configuration management information may include the physical dimensions of the data center, the location and identity of data center equipment and of other data center elements, and data center resource capacity, redundancy and runtime requirements. Configuration management information may also include data center element characteristics such as data center resource consumption and production information. This consumption and production information may include historical, empirical measurements of the data center resources produced or consumed by data center elements. The consumption and production information may also include production and consumption rate values based on theoretically modeled values (e.g. nameplate values) or based on stored, empirical historical measurements.

In some examples, the data center management appliance 206 uses the historical measurements to maintain, within the configuration management database 312, a set of data center resource consumption and production benchmarks. In one example, these benchmarks, which are specific to the manufacturer and model of data center elements, are summaries that are based on actual, practical usage of the data center elements rather than theoretical values (e.g. nameplate values). In another example, the benchmarks are based on a combination of empirical and theoretical values i.e. measured and modeled data. Examples of summaries that may be used as a benchmarks include, among others, minimum, maximum and average data center resource consumption or production, data center resource consumption or production as a function of time, e.g. power or cooling consumption or production by day of week, week of year, etc., actual data center resource consumption or production when a change in either is requested, and data center resource consumption or production as a function of data center element utilization. The information used to calculate the summaries may be gathered from the initial design on the data center, including customer or system provider entered benchmarks, and ongoing parameter measurement. Utilizing actual, historical measurements may lead to more accurate summaries than the nameplate values and, in turn, may provide more accurate simulations.

The configuration management database 312 may take the form of any logical construction capable of storing information on a computer readable medium including flat files, indexed files, hierarchical databases, relational databases or object oriented databases. In addition, links, pointers, indicators and other references to data may be stored in place, of or in addition to, actual copies of the data. The data may be modeled using unique and foreign key relationships and indexes. The unique and foreign key relationships and indexes may be established between the various fields and tables to ensure both data integrity and data interchange performance.

Furthermore, the structure and content of each of these various fields and tables depends on the type of data stored therein. Thus, in at least one example, the data structures and objects within the configuration management database 312 are specially configured to store configuration management information. Consequently, in this example, any process that accesses this data must be specially configured to account for the type of data accessed.

In some examples in accord with FIG. 3, the simulators 304, 306, 308 and 310 include elements configured to model the effect of nonstandard data center element operation on the availability of certain data center resources within the data center. Based on the resulting data center resource availability, the simulators 304, 306, 308 and 310 determine how other data center elements will be affected by the nonstandard data center element operation. More particularly, in this example, each of the simulators 304, 306, 308 and 310 includes elements configured to provide an interface through which the simulator can receive information regarding one or more data center elements targeted for nonstandard operation impact analysis. This information may include information indicating which data center elements are targeted for nonstandard operation impact analysis and may include information qualitatively and quantitatively defining the nonstandard operations exhibited by the targeted data center elements. In the example shown in FIG. 3, each of the simulators 304, 306, 308 and 310 can receive this information from the nonstandard operation impact analysis interface 302.

In addition, in this example, each of the simulators 304, 306, 308 and 310 includes elements configured to provide an interface through which the simulator can receive configuration management information from the configuration management database 312. This configuration management information may include data center resource production and consumption information, such as benchmark consumption and production rates, for various data center elements included within the modeled data center. According to this example, each of the simulators 304, 306, 308 and 310 has elements configured to use information received from the nonstandard operation impact analysis interface 302 and the configuration management database 312 to simulate the nonstandard operational state for the target data center element. These simulators also include elements configured to determine the availability of data center resources as influenced by the nonstandard data center element operation and produce and store a list of data center elements expected to be impacted by resulting data center resource availability. This list may include indications of data center elements expected to be affected by the nonstandard operations and data quantitatively and qualitatively defining the altered operations of the affected data center elements. Also, in this example, each of the simulators includes elements configured to provide the results of the analysis to the nonstandard operation impact analysis interface 302. The results provided by the simulators may include, for example, the list of impacted data center elements.

In the example shown, each of the simulators 304, 306, 308 and 310 is focused on modeling the availability of a particular data center resource and how, in turn, the modeled availability of the data center resource impacts other elements of the data center. In particular, cooling simulator 304 is focused on analyzing cooling, power simulator 306 is focused on analyzing power, network connectivity simulator 308 is focused on analyzing network connectivity and weight support simulator 310 is focused on analyzing weight support. Each of these simulators may employ specialized modeling techniques to determine the impact of nonstandard data center element operation. For instance, in one example, the cooling simulator 304 employs the modeling techniques discussed in U.S. Pat.

No. 7,596,476 and U.S. patent application Ser. No. 11/342,300, both entitled "METHODS AND SYSTEMS FOR MANAGING FACILITY POWER AND COOLING," each of which is hereby incorporate by reference in its entirety. While the example shown in FIG. 3 illustrates 4 simulators, other simulators may be used and examples are not limited to any particular set of simulators. Moreover, in some examples, hybrid simulators that focus on a plurality of data center resources may be employed.

As depicted in FIG. 3, the data center management appliance 206 exposes the nonstandard operation impact analysis interface 302 to exchange nonstandard operation analysis data with external entities, such as the user 202. This nonstandard operation analysis data may include, among other information, information associated with particular data center elements selected by an external entity for nonstandard operation analysis and information associated with the results of the nonstandard operation impact analysis. In one example, the nonstandard operation impact analysis interface 302 includes elements configured to receive configuration management information regarding data center elements, such as routers, CRACs and UPSs, from the configuration management database 312. According to this example, the elements of the nonstandard operation impact analysis interface 302 are also configured to use the configuration management information to present indications of the data center elements to an external entity. In addition, according to this example, the nonstandard operation impact analysis interface 302 has elements configured to receive indications of which data center elements have been selected for nonstandard operation analysis by the external entity.

In some examples in accord with FIG. 3, the nonstandard operation impact analysis interface 302 includes elements configured to determine the data center resources that would be affected by a nonstandard operation of the selected data center elements. For instance, according to this example, if the user 202 requests a nonstandard operation impact analysis for a CRAC unit, the nonstandard operation impact analysis interface 302 would determine, with reference to configuration management information stored in the configuration management database 312, that both cooling and power would be affected. Further, as shown in FIG. 3, elements included in the nonstandard operation impact analysis interface 302 are configured to initiate one or more simulators that correspond to the data center resources that would be affected by the nonstandard operation. In the example of FIG. 3, simulators 304, 306, 308 and 310 are available to model the impact of nonstandard operations that affect consumption or production of cooling, power, network connectivity and weight support, respectively. Other examples may employ additional simulators. Also, in this example, the nonstandard operation impact analysis interface 302 includes elements configured to receive analysis results from the simulators 304, 306, 308 and 310 and return the results to the external entity that requested the nonstandard operation impact analysis, i.e. in this example user 202. In other examples, the nonstandard operation impact analysis interface 302 stores the results within a database which may be used to perform further analysis and thereby gain an increased understanding of the performance characteristics of particular data center configurations.

Table 1 illustrates one example of the information that may result from a nonstandard operation impact analysis of a data center that includes Rack 1, Rack 2, Rack 3, RMAC 1, RMAC 2 and PDU1. Examples may include other types of result information and examples are not limited to a particular set of result information or particular relationships within the result information.

TABLE 1

|  | Rack 1 | Rack 2 | Rack 3 |
| --- | --- | --- | --- |
| RMAC 1 | Fail | Fail | No impact |
| RMAC 2 | No impact | Fail | Fail |
| PDU 1 | Fail | No impact | No impact |

As illustrated in Table 1, if RMAC 1 fails, Rack 1 and Rack 2 fail and Rack 3 sustains no impact. If RMAC 2 fails, Rack 1 sustains no impact and Rack 2 and Rack 3 fail. Finally if PDU 1 fails Rack 1 fails and Rack 2 and Rack 3 encounter no impact. This information shows that Rack 1 is impacted by RMAC 1 and PDU1, Rack 2 is impacted by RMAC 1 and RMAC 2, and Rack 3 is only impacted by RMAC 2. Data center personnel may use this information to design data center configurations that minimize the likelihood of failure in certain important racks. With regard to pre-existing data centers, data center personnel may use this information to determine dependencies between data center elements and give priority maintenance to data center elements that supply resources to important racks. Thus, examples provide for a comprehensive analysis of the nonstandard operation of data center elements by calculating the impact of the nonstandard operation across all affected data center resources.

In at least one example in accord with FIG. 3, the nonstandard operation impact analysis interface 302 also includes elements configured to initiate additional, cascading nonstandard operation simulations when the results of a previous nonstandard operation simulation indicate that the operation of additional data center elements will be affected. For instance, the results of a simulated nonstandard operation of a perforated raised floor tile may indicate that a UPS will also fail. The nonstandard operation of the raised floor tile may be reduced air flow through the tile caused by one of a number of conditions. When encountering this circumstance, the nonstandard operation impact analysis interface 302 will initiate an addition simulation to analyze the impact of a nonstandard operation of the UPS. Analysis of the results of the simulated UPS nonstandard operation may, in turn, lead to additional nonstandard operation simulations. In this way, examples accurately model any downstream or upstream effects of data center element nonstandard operations.

According to various examples, the nonstandard operation impact analysis interface 302 has elements configured to take corrective action in response to the results of the nonstandard operation impact analysis. In some examples, the nonstandard operation impact analysis interface 302 is configured to take this corrective action by altering the operation of data center elements to compensate for the effects of the nonstandard operation. In one example, the nonstandard operation impact analysis interface 302 can shift the load on data center elements experiencing nonstandard operations to other data center elements with sufficient capacity to supplement at least a portion of the load. For instance, the nonstandard operation impact analysis interface 302 can respond to a failed PDU by instructing two other PDUs to supply power to the load of the failed PDU. In another instance, the nonstandard operation impact analysis interface 302 can respond to a failure of a server that is a part of a particular virtual machine by initiating the addition of another server to the virtual machine or by moving the virtual machine to an entirely new set of servers.

In another example, the nonstandard operation impact analysis interface 302 can change the demand for affected data center resources by initiating a shutting down of a subset of data center elements. In this example, the nonstandard operation impact analysis interface 302 is configured to determine which subset of data center elements to shutdown based on the potential benefits of shutting down the subset with respect to the availability of the affected data center resources and based on the importance of the processes supported by the subset compared to the importance of the processes supported by the data center elements operating in a nonstandard fashion and the affected data center elements. The importance of the processes may be determined, for example, with reference to the importance of the business operations supported by the process. In some instances, the subset shutdown may include all or portion of the affected data center elements. Thus some examples provide for rapid and intelligent response to the potential impact of nonstandard operational behavior of data center elements.

Figure 4:
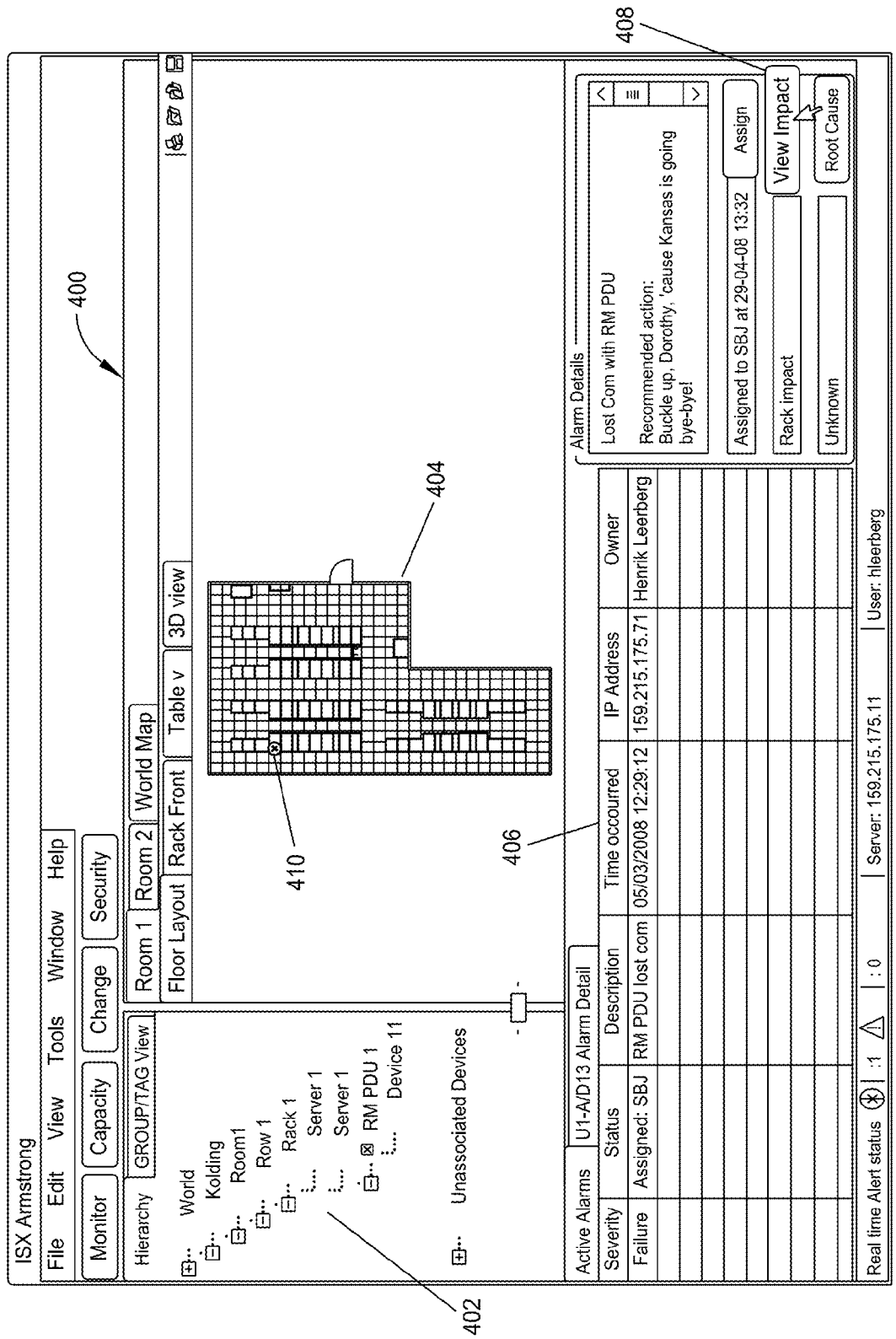
FIG. 4 is a diagram of a user interface in accord with the present invention.
Figure 5:
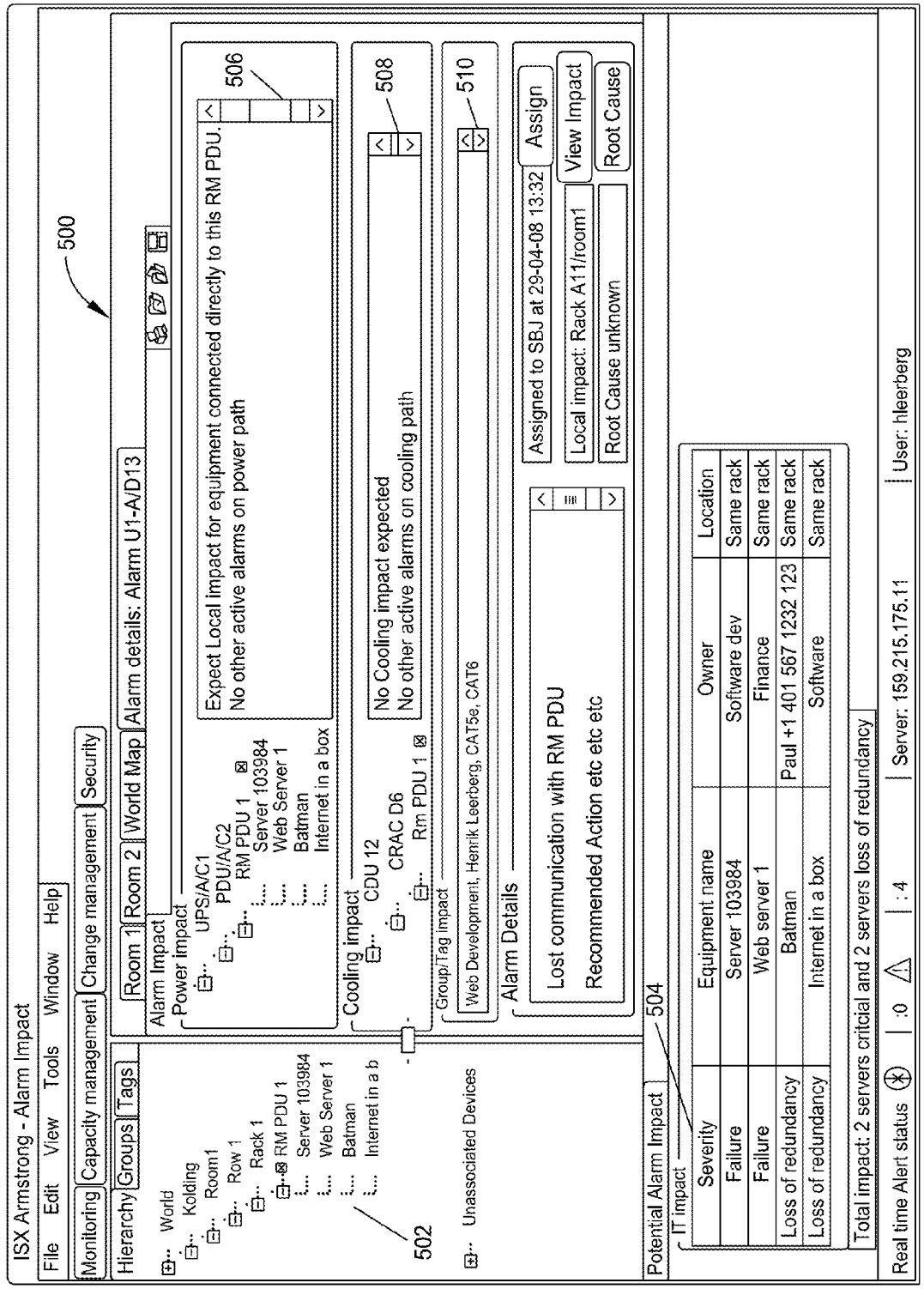
FIG. 5 is a diagram of a user interface in accord with the present invention.

In various examples, the nonstandard operation impact analysis interface 302 employs a wide variety of technologies, user interface elements and interface metaphors to exchange information with external entities. FIGS. 4 and 5 illustrate two screens 400 and 500 that are included within an example nonstandard operation impact analysis interface, such as the nonstandard operation impact analysis interface 302. As shown, the screen 400 includes a data center drill down menu 402, a floor editor 404, an active alarm section 406 and view impact button 408. The drill down menu 402 includes elements configured to present a logical representation of a hierarchy of data center elements. According to various examples, the levels presented within the hierarchy are configurable. In the example shown, the levels of the hierarchy include a base level, termed "world" and progress through levels that specify the location of data center elements with greater precision. As shown, these levels include a data center level, a room level, a row level and a rack level. When a particular level is actuated, the drill down menu 402 reveals data center elements that fall beneath the actuated level.

In addition, in the example illustrated in FIG. 4, the drill down menu 402 includes elements configured to indicate data center elements that are operating in a nonstandard way. These indications may take various forms including, but not limited to, highlighting, coloring, shade, bold font and the like. In the example shown, the drill down menu shows that RM PDU1 has stopped communicating with the data center management appliance presenting the nonstandard operation impact analysis interface 302.

As depicted, the floor editor 404 presents a visual representation of the physical layout of the data center. In this example, the floor editor also presents an indicator 410 that indicates RM PDU1 has stopped communications. Also as illustrated, the active alarm section 406 provides additional information regarding data center elements that are operating in nonstandard fashion. In this instance, as shown the active alarm section 406 provides additional information regarding RM PDU1. Also as shown, the view impact button 408, when actuated, will cause the nonstandard operation impact analysis interface 302 to initiate a nonstandard operation impact analysis of the selected data center element and provide the results of the analysis using the screen 500 shown in FIG. 5. In the instance shown, the data center element selected for nonstandard operation impact analysis is RM PDU1.

As discussed above, FIG. 5 illustrates the screen 500 for presenting the results of a nonstandard operation impact analysis. In the example shown, the screen 500 includes a data center drill down menu 502, an IT impact section 504, a power impact section 506, a cooling impact section 508, a group/tag impact section 510. As shown, the drill down menu 502 includes elements configured to indicate data center elements that will be affected according to the results of the nonstandard operation impact analysis. In the example shown, the affected data center elements are Server 103984, Web server 1, Batman and Internet in a box.

The other sections of the screen 500 provide greater detail regarding the results of the nonstandard operation analysis. For example, the power impact section 506 includes elements configured to present indications of data center elements whose power will be affected according to the results of the nonstandard operation impact analysis. In the instance shown, the power impact section 506 indicates that all data center elements that consume power distributed via RM PDU1 are expected to be influenced by the nonstandard operation of RM PDU1. Also as depicted, the cooling impact section 508 section include elements configured to present indications of data center elements whose cooling will be affected according to the results of the nonstandard operation impact analysis. In the instance shown, no data center elements that consume or produce cooling are expected to be affected by the nonstandard operation of RM PDU1.

In the example shown, the group/tag impact section 510 includes elements configured to present an indication of which logical groups defined within the configuration management database 312 will be impacted according to the results of the nonstandard operation impact analysis. In the instance shown, data center elements that are members of the following groups will be affected according to the results of the nonstandard operation impact analysis: Web Development, Hennik Leeberg, CAT5e and CAT6. Also as shown, the IT impact analysis section 504 has elements configured to present an indication of data center elements whose network connectivity will be affected according to the results of the nonstandard operation impact analysis. In addition, the IT impact section 510 has elements configured to provide additional information regarding the affected data center elements and how the operations of the affected data center elements will be altered. In the instance shown, both Server 103984 and Web server 1 are expected to no longer be connected to the network. Batman and Internet in a box are expected to simply experience a loss of redundancy, but remain active on the network. Thus, examples provide for nonstandard operation impact analysis interfaces that provide nonstandard operation analysis information which incorporates actual nonstandard operation information, such as the illustrated nonstandard operation of RM PDU1, and modeled nonstandard operation information that spans data center resources and the data center elements that consume and produce these data center resources.

Each of the interfaces disclosed herein exchange information with various providers and consumers. These providers and consumers may include any external entity including, among other entities, users and systems. In addition, each of the interfaces disclosed herein may both restrict input to a predefined set of values and validate any information entered prior to using the information or providing the information to other components. Additionally, each of the interfaces disclosed herein may validate the identity of an external entity prior to, or during, interaction with the external entity. These functions may prevent the introduction of erroneous data into the system or unauthorized access to the system.

Nonstandard Operation Impact Processes

Various examples provide processes for analyzing the impact of nonstandard operation of elements of a data center.

Figure 6:
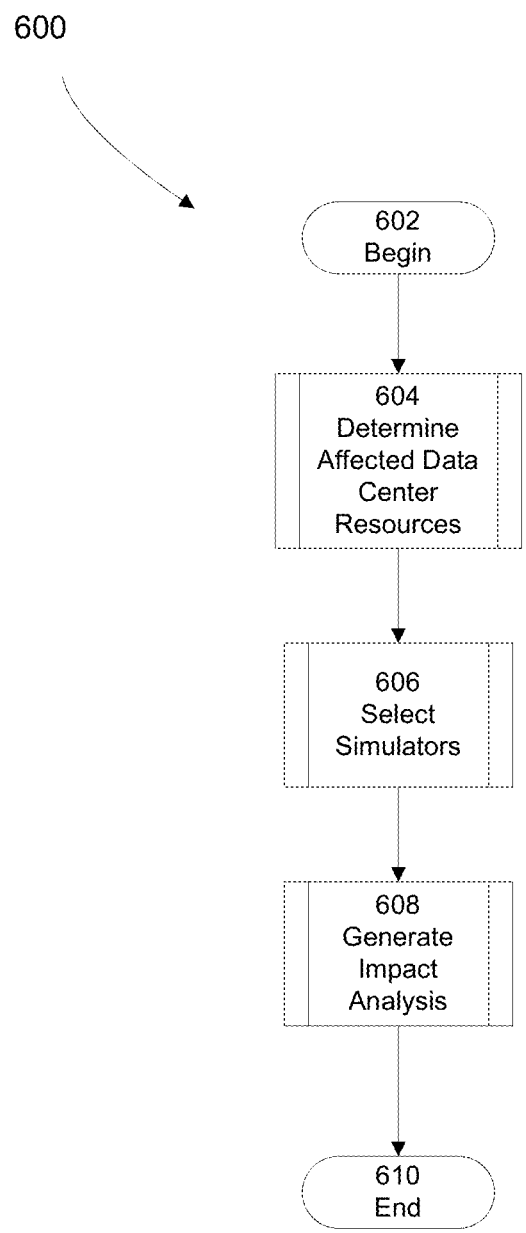
FIG. 6 is a flow chart of an example process for conducting a nonstandard operation impact analysis in accord with aspects of the present invention.

FIG. 6 illustrates one such process 600 that includes acts of determining data center resources affected by the nonstandard operation of a data center element, selecting simulators that model the data center with respect to the affected data center resource and generating an impact analysis reflecting the nonstandard operation of the data center element. In at least one example in accord with FIG. 6, a data center management appliance arranged and configured as the data center management appliance 206 performs acts included in process 600. Process 600 begins at 602.

In act 604, affected data center resources are determined. According to various examples, a data center management appliance determines the data center 987700.1 resources affected by nonstandard operation of the data center element by executing elements of the nonstandard operation impact analysis interface 302. Acts in accord with these examples are discussed below with reference to FIG. 7.

In act 606, simulators are selected. According to some examples, a data center management appliance selects simulators that focus on the data center resources determined in act 604 by executing elements of the nonstandard operation impact analysis interface 302. Acts in accord with these examples are discussed below with reference to FIG. 8.

In act 608, an impact analysis is generated. According to several examples, a data center management appliance generates the impact analysis using a plurality of simulators, such as simulators 304, 306, 308 and 310. Acts in accord with these examples are discussed below with reference to FIG. 9.

Process 600 ends at 610. Nonstandard operation impact analysis processes in accord with process 600 allow data center operational personnel to identify potential weaknesses in particular data center configurations and to prioritize action responsive to nonstandard data center element behavior in a manner appropriate to the severity of the impact. Processes such as process 600 may be initiated for a variety of reasons. In one example, process 600 is initiated upon detection, by a management system, of one or more data center elements operating in a nonstandard fashion. In another example, process 600 is executed at the request of an external entity to determine the effect of a hypothetical nonstandard operation.

Figure 7:
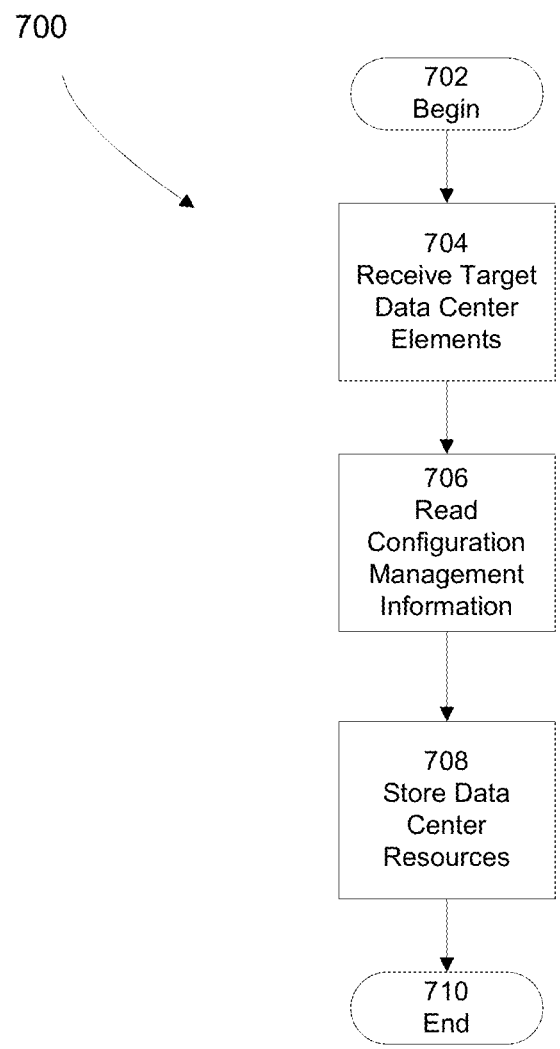
FIG. 7 is a flow chart of an example process for determining affected data center resources in accord with aspects of the present invention.

As discussed above with regard to act 604 shown in FIG. 6, various examples provide processes for determining data center resources affected by nonstandard operation of data center elements. FIG. 7 illustrates one such process 700 that includes acts of receiving data center elements targeted for nonstandard operation impact analysis, reading configuration management information and storing the data center resources that will be affected by the nonstandard operation. Process 700 begins at 702.

In act 704, a data center management appliance provides an interface through which the data center management appliance may receive indications of data center elements targeted for nonstandard operation impact analysis. In at least one example, the data center management appliance performing this action exposes a system interface via a network, such as the network 208, to an external system. In another example, the data center appliance provides a user interface to a user. In both of these examples, the data center management appliance receives information regarding data center elements targeted for nonstandard behavior analysis. This information may include information identifying the target data center elements and information specifying the nonstandard operation of the target data center elements.

In act 706, a data center management appliance reads configuration management information associated with the data center elements targeted for analysis. In one example, the data center management appliance reads this configuration management information from a configuration management database, such as the configuration management database 312. This configuration management information may include indications of which data center resources the target data center elements consume and produce. In act 708, the data center management appliance stores, in local storage (such as data storage 118), the data center resources consumed or produced by the targeted data center elements.

Process 700 ends at 710. Various examples in accord with the process 700 enable data center management appliances to determine which data center resources that may be impacted by nonstandard operation of the target data center elements. For instance, if a CRAC is targeted for nonstandard operation impact analysis, process 700 may determine that both power consumed by the CRAC and cooling supplied by the CRAC may be altered by nonstandard operation of the CRAC.

Figure 8:
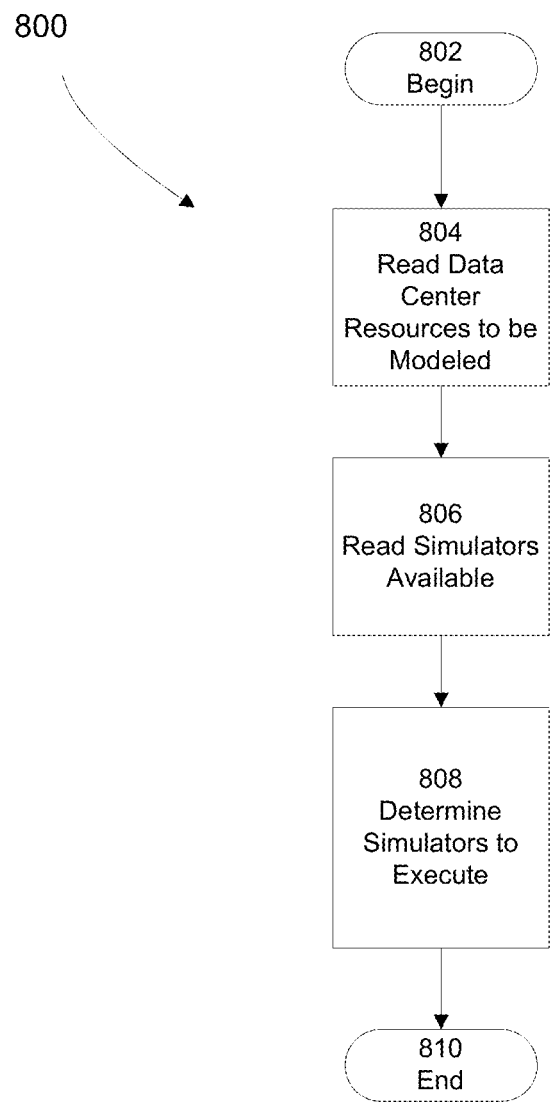
FIG. 8 is a flow chart of an example process for selecting simulators in accord with aspects of the present invention.

As discussed above with regard to act 606 shown in FIG. 6, various examples provide processes for selecting one or more simulators to model the availability of data center resources when the target data center elements operate in a nonstandard fashion. FIG. 8 illustrates one such process 800 that includes acts of reading data center resources to be modeled, reading the simulators that are available and determining which of the available simulators should be used to model the data center resources. Process 800 begins at 802.

In act 804, a data center management appliance reads the data center resources to be modeled from local storage. In act 806, a data center management appliance reads, from local storage, information regarding the simulators that are available for modeling data center resources. In one example, this information specifies that simulators capable of modeling cooling, power, network connectivity and weight support are available. Other simulators may be available and examples are not limited to a specific set of simulators. In act 808, the data center management appliance determines the simulators that best fit the data center resources to be modeled. In one example, the data center management appliance simply selects simulators that focus on modeling the same data center resources as those to be modeled.

Process 800 ends at 810. Processes in accord with the process 800 allow a data center management appliance determine which simulators to use in modeling the nonstandard operation of the targeted data center elements. For instance, if a CRAC is targeted for nonstandard operation impact analysis, process 800 may determine that a simulator focused on cooling, such as the cooling simulator 304, and a simulator focused on power, such as the power simulator 306, should be used to determine the overall impact of the nonstandard operation of the CRAC.

Figure 9:
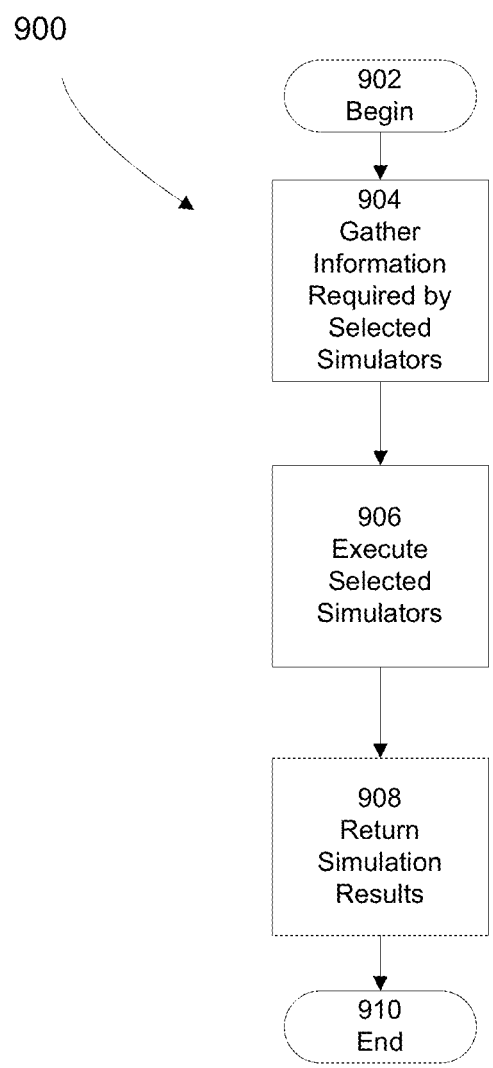
FIG. 9 is a flow chart of an example process for generating an impact analysis in accord with aspects of the present invention.

As discussed above with regard to act 608 shown in FIG. 6, various examples provide processes for a data center management appliance to generate an impact analysis. FIG. 9 illustrates one such process 900 that includes acts of gathering the information required by selected simulators, executing the simulators and returning analysis results to an external entity. Process 900 begins at 902.

In act 904, a data center management appliance gathers the information required by the selected simulators. This information may include, among other information, indications of the data center elements targeted for nonstandard operation impact analysis, qualitative and quantitative information specifying the nonstandard operation of the target data center elements and configuration management information specifying the physical layout of the data center and the equipment disposed within the data center. In act 906, the data center management appliance executes the selected simulators using the information gathered in act 904 above and stores the results of the simulations in local storage. In act 908, the data center management appliance provides the results of the simulations to the entity requesting the nonstandard operation impact analysis.

Process 900 ends at 910. Upon completion of process 900, a data center management appliance has successfully conducted a nonstandard operation impact analysis. For instance, if a CRAC is targeted for nonstandard operation impact analysis, process 900 may provide results specifying both an increase in power available and a decrease in cooling available. In addition, the results may specify how the operation of other data center elements will be impacted by the increase in available power and the decrease in available cooling. In addition, as discussed above, a data center management appliance can take corrective action based on the results of the nonstandard operation impact analysis and examples include methods for conducting this corrective action.

Each of processes 600 through 900 depicts one particular sequence of acts in a particular example. The acts included in each of these processes may be performed by, or using, one or more data center management appliances as discussed herein. Some acts are optional and, as such, may be omitted in accord with one or more examples. Additionally, the order of acts can be altered, or other acts can be added, without departing from the scope of the apparatus and methods discussed herein. In addition, as discussed above, in at least one example, the acts are performed on a particular, specially configured machine, namely a data center management appliance configured according to the examples disclosed herein.

Having now described some illustrative aspects, it should be apparent to those skilled in the art that the foregoing is merely illustrative and not limiting, having been presented by way of example only. Similarly, aspects may be used to achieve other objectives. For instance, in one example, instead of (or in addition to) analyzing the impact of nonstandard operation, the data center management appliance may take corrective action based on the results of the nonstandard operation impact analysis. Numerous modifications and other illustrative examples are within the scope of one of ordinary skill in the art and are contemplated as falling within the scope of the apparatus and methods disclosed herein. In particular, although many of the examples presented herein involve specific combinations of method acts or system elements, it should be understood that those acts and those elements may be combined in other ways to accomplish the same objectives.

What is claimed is:

1. A method for simulating, using a computer system including memory and at least one processor coupled to the memory, nonstandard operation of an element of a data center, the method comprising:
   determining, by the computer system, at least first one data center resource affected by at least one first data center element;
   selecting, by the computer system, at least one first simulator from a plurality of different simulators based at least in part on the at least one first data center resource and the at least one first data center element; and
   generating, by the computer system, a first impact analysis of the nonstandard operation of the at least one first data center element using the at least one first simulator, wherein generating the analysis includes identifying at least one second data center element affected by the nonstandard operation of the at least one first data center element.

2. The method according to claim 1, wherein determining the at least one first data center resource includes receiving configuration management information from a database of benchmarks calculated at least in part on modeled information and at least in part on measurements taken during operation of the data center.

3. The method according to claim 1, wherein selecting the at least one first simulator includes selecting at least two simulators and generating the impact analysis includes generating an impact analysis that spans at least two data center resources.

4. The method according to claim 1, wherein selecting the at least one first simulator from the plurality of simulators includes selecting the at least one first simulator from a plurality of simulators including at least one of a cooling simulator and a power simulator.

5. The method according to claim 1, wherein generating the first impact analysis includes:
   generating a list of critically impacted data center elements; and
   generating a list of data center elements with affected redundancy.

6. The method according to claim 5, further comprising:
   determining at least one second data center resource affected by at least one third data center element identified in the list of critically impacted data center elements;
   selecting at least one second simulator from the plurality of simulators based at least in part on the at least one second data center resource and the at least one third data center element; and
   generating a second impact analysis of nonstandard operation of the at least one third data center element using the at least one second simulator.

7. The method according to claim 1, further comprising providing the impact analysis to an external entity.

8. The method according to claim 7, wherein providing the impact analysis to the external entity includes providing the impact analysis to an external system via a system interface.

9. The method according to claim 7, wherein providing the impact analysis to the external entity includes providing the impact analysis to a user via a user interface.

10. A data center management appliance comprising:
    a network interface;
    a memory; and
    a controller coupled to the network interface and the memory and configured to:
    determine at least one first data center resource affected by at least one first data center element;
    select at least one first simulator from a plurality of different simulators based at least in part on the at least one first data center resource and the at least one first data center element; and
    generate a first impact analysis of nonstandard operation of the at least one first data center element using the at least one first simulator, the first impact analysis identifying at least one second data center element affected by the nonstandard operation of the at least one first data center element.

11. The data center management appliance according to claim 10, wherein the controller configured to determine the at least one first data center resource is further configured to receive configuration management information from a database of benchmarks calculated at least in part on modeled information and at least in part on measurements taken during operation of the data center.

12. The data center management appliance according to claim 10, wherein the controller configured to select the at least one first simulator and generate the impact analysis is further configured to select at least two simulators and generate an impact analysis that spans at least two data center resources.

13. The data center management appliance according to claim 10, wherein the controller configured to select the at least one first simulator from the plurality of simulators is further configured to select the at least one first simulator from a plurality of simulators including at least one of a cooling simulator and a power simulator.

14. The data center management appliance according to claim 10, wherein the controller configured to generate the first impact analysis is further configured to:
   generate a list of critically impacted data center elements; and
   generate a list of data center elements with affected redundancy.

15. The data center management appliance according to claim 14, wherein the controller is further configured to:
   determine at least one second data center resource affected by at least one third data center element identified in the list of critically impacted data center elements;
   select at least one second simulator from the plurality of simulators based at least in part on the at least one second data center resource and the at least one third data center element; and
   generate a second impact analysis using the at least one second simulator.

16. The data center management appliance according to claim 10, wherein the controller is further configured to provide the impact analysis to an external entity.

17. The data center management appliance according to claim 16, wherein the controller configured to provide the impact analysis to the external entity is further configured to provide the impact analysis to an external system via a system interface.

18. The data center management appliance according to claim 16, wherein the controller configured to provide the impact analysis to the external entity is further configured to provide the impact analysis to a user via a user interface.

19. A data center management appliance comprising:
   a network interface;
   a memory; and
   means for analyzing, for a plurality of data center resources, an impact of nonstandard operation of at least one first data center element, the means for analyzing including:
      means for identifying at least one second data center element affected by the nonstandard operation of the at least one first data center element; and
      means for selecting at least one first simulator from a plurality of different simulators based at least in part on the at least one first data center element and at least one first data center resource affected by the at least one first data center element.

20. The data center management appliance according to claim 19, wherein the means for analyzing includes a means for analyzing at least one of cooling and power.

* * * * *

UNITED STATES PATENT AND TRADEMARK OFFICE
CERTIFICATE OF CORRECTION

| | | |
|---|---|---|
| PATENT NO. | : 8,433,547 B2 | |
| APPLICATION NO. | : 12/630035 | |
| DATED | : April 30, 2013 | |
| INVENTOR(S) | : Mikkel Dalgas et al. | |

It is certified that error appears in the above-identified patent and that said Letters Patent is hereby corrected as shown below:

In the Specification:

Column 17, Line 13, delete "987700.1"

Signed and Sealed this
Twentieth Day of August, 2013

Teresa Stanek Rea
*Acting Director of the United States Patent and Trademark Office*